United States Patent
Wang et al.

(10) Patent No.: US 9,336,900 B2
(45) Date of Patent: May 10, 2016

(54) SHIFT REGISTER AND METHOD OF DRIVING THE SAME, AND GROUP OF SHIFT REGISTERS AND METHOD OF DRIVING THE SAME

(71) Applicants: Shanghai Tianma Micro-Electronics Co., Ltd., Shanghai (CN); Tianma Micro-Electronics Co., Ltd., Shenzhen (CN)

(72) Inventors: Zhiliang Wang, Shanghai (CN); Xian Chen, Shanghai (CN); Liyuan Luo, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 139 days.

(21) Appl. No.: 14/472,245

(22) Filed: Aug. 28, 2014

(65) Prior Publication Data
US 2015/0348646 A1    Dec. 3, 2015

(30) Foreign Application Priority Data

May 27, 2014  (CN) .......................... 2014 1 0226541

(51) Int. Cl.
| | |
|---|---|
| *G11C 19/00* | (2006.01) |
| *G11C 19/28* | (2006.01) |
| *G09G 5/18* | (2006.01) |
| *G11C 19/18* | (2006.01) |

(52) U.S. Cl.
CPC ................ *G11C 19/287* (2013.01); *G09G 5/18* (2013.01); *G11C 19/28* (2013.01); *G09G 2300/0404* (2013.01); *G09G 2310/0286* (2013.01); *G11C 19/184* (2013.01)

(58) Field of Classification Search
None
See application file for complete search history.

(56) References Cited

U.S. PATENT DOCUMENTS

| | | | | |
|---|---|---|---|---|
| 6,928,135 | B2* | 8/2005 | Sasaki | G11C 8/04 345/100 |
| 7,447,292 | B2* | 11/2008 | Hsu | G11C 19/28 377/64 |
| 2004/0140839 | A1* | 7/2004 | Nagao | G11C 19/28 327/291 |
| 2007/0014390 | A1 | 1/2007 | Huang et al. | |
| 2007/0139348 | A1* | 6/2007 | Lee | G09G 3/3674 345/100 |
| 2008/0062097 | A1* | 3/2008 | Jeong | G09G 3/3266 345/84 |
| 2010/0201659 | A1* | 8/2010 | Miyake | G09G 3/3677 345/205 |
| 2012/0112992 | A1* | 5/2012 | Otose | G09G 3/3674 345/100 |
| 2015/0015558 | A1* | 1/2015 | Sasaki | G09G 3/3677 345/211 |
| 2015/0016585 | A1* | 1/2015 | Toyotaka | G11C 19/287 377/77 |
| 2015/0340102 | A1* | 11/2015 | Qian | G11C 27/04 377/54 |

FOREIGN PATENT DOCUMENTS

| | | |
|---|---|---|
| CN | 100354711 C | 12/2007 |
| CN | 101594135 A | 12/2009 |

* cited by examiner

*Primary Examiner* — Tuan T Lam
(74) *Attorney, Agent, or Firm* — Alston & Bird LLP

(57) ABSTRACT

A shift register circuit is disclosed. In some embodiments, the shift register circuit includes six transistors and no capacitors. A group of such shift register circuits is also disclosed. In some embodiments, the shift registers of the group are connected so as to be configured to provide driving signals for a display. A method of using the shift registers is also disclosed.

12 Claims, 4 Drawing Sheets

SHIFT REGISTER AND METHOD OF DRIVING THE SAME, AND GROUP OF SHIFT REGISTERS AND METHOD OF DRIVING THE SAME

CROSS-REFERENCES TO RELATED APPLICATIONS

This application claims the benefit of priority to Chinese Patent Application No. 201410226541.6, filed with the Chinese Patent Office on May 27, 2014 and entitled "SHIFT REGISTER AND METHOD OF DRIVING THE SAME, AND GROUP OF SHIFT REGISTERS AND METHOD OF DRIVING THE SAME", the content of which is incorporated herein by reference in its entirety.

TECHNICAL FIELD

The present invention relates to the field of driving devices and particularly to a shift register and method of driving the same, and a group of shift registers and method of driving the same in a display drive circuit.

BACKGROUND OF THE INVENTION

In recent years, an active matrix display device has been popularized, for example, widely applied in a mobile phone, a tablet computer, an MP3, an MP4 and other mobile devices. In the prior art, the display device comprises a plurality of scan lines (gate lines), a plurality of signal lines (data lines), a scan line (gate line) drive circuit and a signal line (data line) drive circuit. The respective drive circuits are embodied as scan circuits constituted of a plurality of transistors.

A Complementary Metal Oxide Semiconductor (CMOS) circuit composed of some n-channel transistors (NMOS) and some p-channel transistors (PMOS) is generally used in a shift register constituting such a scan circuit. However the concurrent fabrication of both the n-channel transistors and the p-channel transistors may result in the problems of a large number of process steps in and a high production cost of fabricating the Complementary Metal Oxide Semiconductor (CMOS) circuit.

Moreover capacitor devices are also present in the shift register of the scan circuit, and the combination of the capacitors and the transistors may have the circuit complicated and the number of devices further increased, thus resulting in an increase in area of the frame edge of a display.

BRIEF SUMMARY OF THE INVENTION

One inventive aspect is a shift register. The shift register includes first through sixth transistors. A gate of the first transistor is connected to a first clock signal terminal, a source of the first transistor is connected to a first input signal terminal, and a drain of the first transistor is connected to a source of the second transistor and a gate of the sixth transistor. A gate of the second transistor is connected to a first level signal terminal, the source of the second transistor is connected to the drain of the first transistor and the gate of the sixth transistor, and a drain of the second transistor is connected to a gate of the third transistor. The gate of the third transistor is connected to the drain of the second transistor, a source of the third transistor is connected to a second clock signal terminal, and a drain of the third transistor is connected to an output terminal and a drain of the fifth transistor. A gate of the fourth transistor is connected to a source of the fourth transistor, the gate and the source of the fourth transistor are connected to a second input signal terminal, and a drain of the fourth transistor is connected to a gate of the fifth transistor and a drain of the sixth transistor. The gate of the fifth transistor is connected to the drain of the fourth transistor and the drain of the sixth transistor, a source of the fifth transistor is connected to a second level signal terminal and a source of the sixth transistor, and the drain of the fifth transistor is connected to the output terminal and the drain of the third transistor. The gate of the sixth transistor is connected to the drain of the first transistor and the source of the second transistor, the source of the sixth transistor is connected to the second level signal terminal and the source of the fifth transistor, and the drain of the sixth transistor is connected to the drain of the fourth transistor and the gate of the fifth transistor.

DETAILED DESCRIPTION OF THE PREFERRED EMBODIMENTS

Particular embodiments of the invention will be described below in details with reference to the drawings in order to make the foregoing objects, features and advantages of the invention more apparent and readily understood.

Numerous details will be set forth in the following description so as to facilitate understanding of the invention, but the invention can alternatively be practiced in other embodiments than those described here, so the invention will not be limited to the particular embodiments to be disclosed below.

Figure 1:
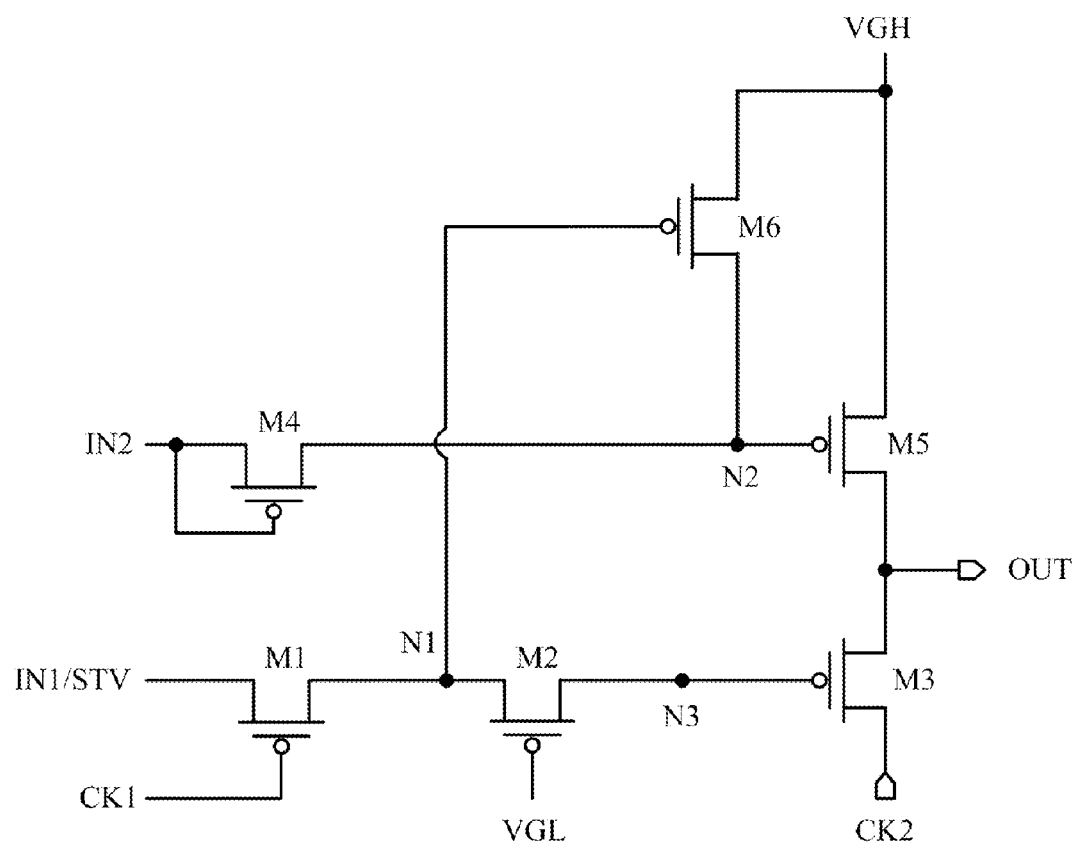
FIG. 1 is a circuit diagram of a shift register according to an embodiment of the invention.

An embodiment of the invention provides a shift register, and FIG. 1 illustrates a schematic circuit scheme of the shift register comprising: a first transistor M1, a second transistor M2, a third transistor M3, a fourth transistor M4, a fifth transistor M5 and a sixth transistor M6.

A gate of the first transistor M1 is connected to a first clock signal terminal CK1, a source of the first transistor M1 is connected to a first input signal terminal IN1, and a drain of the first transistor M1 is connected to a source of the second transistor M2 and a gate of the sixth transistor M6 to a node N1;

A gate of the second transistor M2 is connected to a first level signal terminal VGL, the source of the second transistor M2 is connected to the drain of the first transistor M1 and the gate of the sixth transistor M6 to the node N1, and a drain of the second transistor M2 is connected to a gate of the third transistor M3 to a node N3;

The gate of the third transistor M3 is connected to the drain of the second transistor M2, a source of the third transistor M3 is connected to a second clock signal terminal CK2, and a drain of the third transistor M3 is connected to an output terminal OUT and a drain of the fifth transistor M5;

A gate of the fourth transistor M4 is connected to a source thereof and a second input signal terminal IN2, and a drain of the fourth transistor M4 is connected to a gate of the fifth transistor M5 and a drain of the sixth transistor M6 to a node N2;

The gate of the fifth transistor M5 is connected to the drain of the fourth transistor M4 and the drain of the sixth transistor M6 to the node N2, a source of the fifth transistor M5 is connected to a second level signal terminal VGH and a source of the sixth transistor M6, and the drain of the fifth transistor M5 is connected to the output terminal OUT and the drain of the third transistor M3; and The gate of the sixth transistor M6 is connected to the drain of the first transistor M1 and the source of the second transistor M2, the source of the sixth transistor M6 is connected to the second level signal terminal VGH and the source of the fifth transistor M5, and the drain of the sixth transistor M6 is connected to the drain of the fourth transistor M4 and the gate of the fifth transistor M5 to the node N2.

Furthermore all of the first transistor M1, the second transistor M2, the third transistor M3, the fourth transistor M4, the fifth transistor M5 and the sixth transistor M6 are PMOS transistors.

Figure 2:
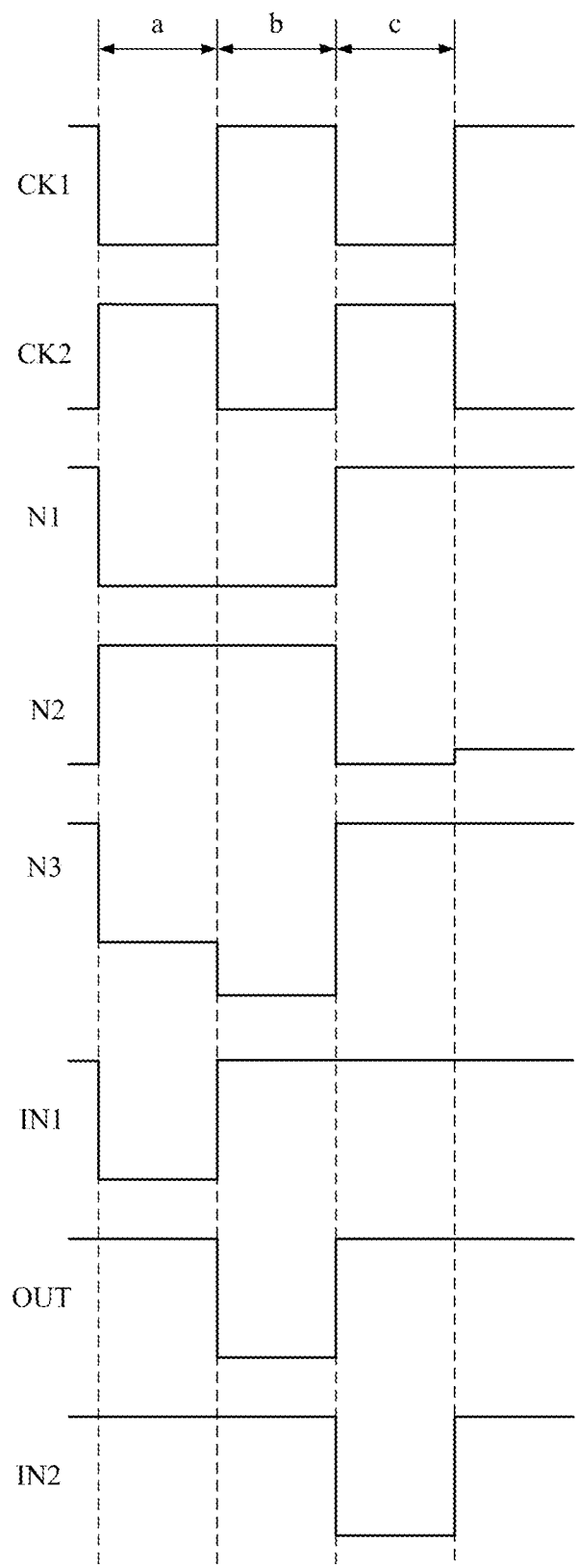
FIG. 2 is a timing diagram of the shift register in FIG. 1 in operation.

In this embodiment, an input signal at the first level signal terminal VGL is a low-level signal, an input signal at the second level signal terminal VGH is a high-level signal, a first input signal is input to the first input signal terminal IN1, a second input signal is input to the second input signal terminal IN2, a first clock signal is input to the first clock signal terminal CK1, and a second clock signal is input to the second clock signal terminal CK2, where the second clock signal is opposite in phase to the first clock signal. FIG. 2 illustrates a timing diagram thereof in operation, and a method of driving the shift register according to this embodiment will be described with reference to FIG. 1 and FIG. 2.

As illustrated in FIG. 1 and FIG. 2, a drive process comprises three phases including a reset phase a, a shift phase b and a turn-off phase c respectively.

In the reset phase a:

The first clock signal which is a low-level pulse signal in the reset phase a is input to the first clock signal terminal CK1 to turn on the first transistor M1;

The low-level signal is input to the first input signal terminal IN1 and is transmitted by the first transistor M1 to the gate of the sixth transistor M6 and the source of the second transistor M2, and the potential at the node N1 is at a low level, thus turning on the sixth transistor M6;

Since the source of the sixth transistor M6 is connected to the second level signal terminal VGH to which the second level signal which is a high-level signal is input, that is, the level of the signal is constant and higher than the level of the subsequent first level signal, the high-level signal is transmitted by the sixth transistor M6 to the gate of the fifth transistor M5, and the potential at the node N2 is at a high level, thus turning off the fifth transistor M5 so that the fifth transistor M5 will not contribute to any change in output;

The first level signal which is a low-level signal is input to the first level signal terminal VGL, that is, the level of the signal is constant and lower than the second level signal described above, thus turning on the second transistor M2; and The low-level signal transmitted by the first transistor M1 is transmitted by the second transistor M2 to the gate of the third transistor M3, and the potential at the node N3 is at a low level, thus turning on the third transistor M3; and since the fifth transistor M5 will not contribute to any change in output, an output at the output terminal OUT is only the second clock signal, transmitted by the third transistor M3, connected to the second clock signal terminal, where the second clock signal opposite in phase to the first clock signal is at a high level at this time, that is, the output at the output terminal OUT is also at a high level thus resetting the entire shift.

In the shift phase b:

The first clock signal connected at the first clock signal terminal CK1 is changed to a high level, thus turning off the first transistor M1, and at this time the potential at the node N1 is kept at a low level in the reset phase a, and the sixth transistor M6 is kept turned on, and since the signal at the gate of the second transistor M2 is constantly at a low level, the second transistor M2 and also the third transistor M3 are kept turned on; and At this time the second clock signal is input to the second clock signal terminal CK2 is changed to a low level, and the potential at the node N3 will be pulled lower due to coupling by the circuit, and at this time the second transistor M2 can suppress excessive leaked current of a parasitic capacitor to thereby achieve an effect of stabilizing the circuit.

Also the high-level signal is still input to the second input signal terminal IN2, thus further turning off the fourth transistor M4, and the high-level signal, transmitted by the sixth transistor M6, input to the second level signal terminal is still input to the gate of the fifth transistor M5, thus turning off the fifth transistor M5 so that the fifth transistor M5 will not contribute to any output at the output terminal, but only the low-level signal which is input to the second clock signal terminal will be transmitted by the third transistor M3 to the output terminal, and the shift function of the shift register has been embodied so far, that is, the low-level pulse signal at the input terminal is shift by one stage for output.

Since the shift register according to this embodiment is typically used in a gate driver, it will be further provided with a hold function for a period of time in which the shift register needs to well hold a output at a high level in the turn-off phase c:

The first clock signal is input to the first clock signal terminal CK1 and is changed to a low level, thus turning on the first transistor M1;

The high-level signal is input to the first input signal terminal IN1 and is transmitted by the first transistor M1 to the gate of the sixth transistor M6 and the source of the second transistor M2, and the potential at the node N1 is at a high level, thus turning off the sixth transistor M6;

Since the signal at the gate of the second transistor M2 is constantly at a low level, the second transistor M2 is kept turned on to transmit the high-level signal, transmitted by the first transistor M1, to the gate of the third transistor M3, and the potential at the node N3 is at a high level, thus turning off the third transistor M3 so that the third transistor M3 will not contribute to any output of the circuit;

The second input signal is input to the second input signal terminal IN2 and is changed to a low level, thus turning on the fourth transistor M4;

The low-level signal is transmitted by the fourth transistor M4 to the gate of the fifth transistor M5, and since the sixth transistor M6 is turned off, the potential at the node N2 is at a low level, thus turning on the fifth transistor M5; and The high-level signal is input to the second level signal terminal and is transmitted by the fifth transistor M5 to the output terminal.

As can be apparent, the shift register according to this embodiment of the invention can enable a correct operation of the circuit, and the second transistor M2 can suppress excessive leaked current of a parasitic capacitor in the shift phase b to thereby have the gate thereof driven correctly; and furthermore the shift register according to this embodiment of the invention can dispense with a capacitor to thereby significantly lower the width of a drive area for a display device, i.e., a non-display area, which is a edge frame area.

Moreover the shift register according to this embodiment of the invention comprises only six PMOS transistors, and since a p-channel transistor (PMOS) circuit alone can be fabricated in a process using two fewer masks than in a process of fabricating an n-channel transistor circuit (NMOS), the shift register according to this embodiment of the invention can be fabricated in a lower number of process steps and at a lower cost than a shift register comprising an NMOS transistor circuit.

Figure 3:
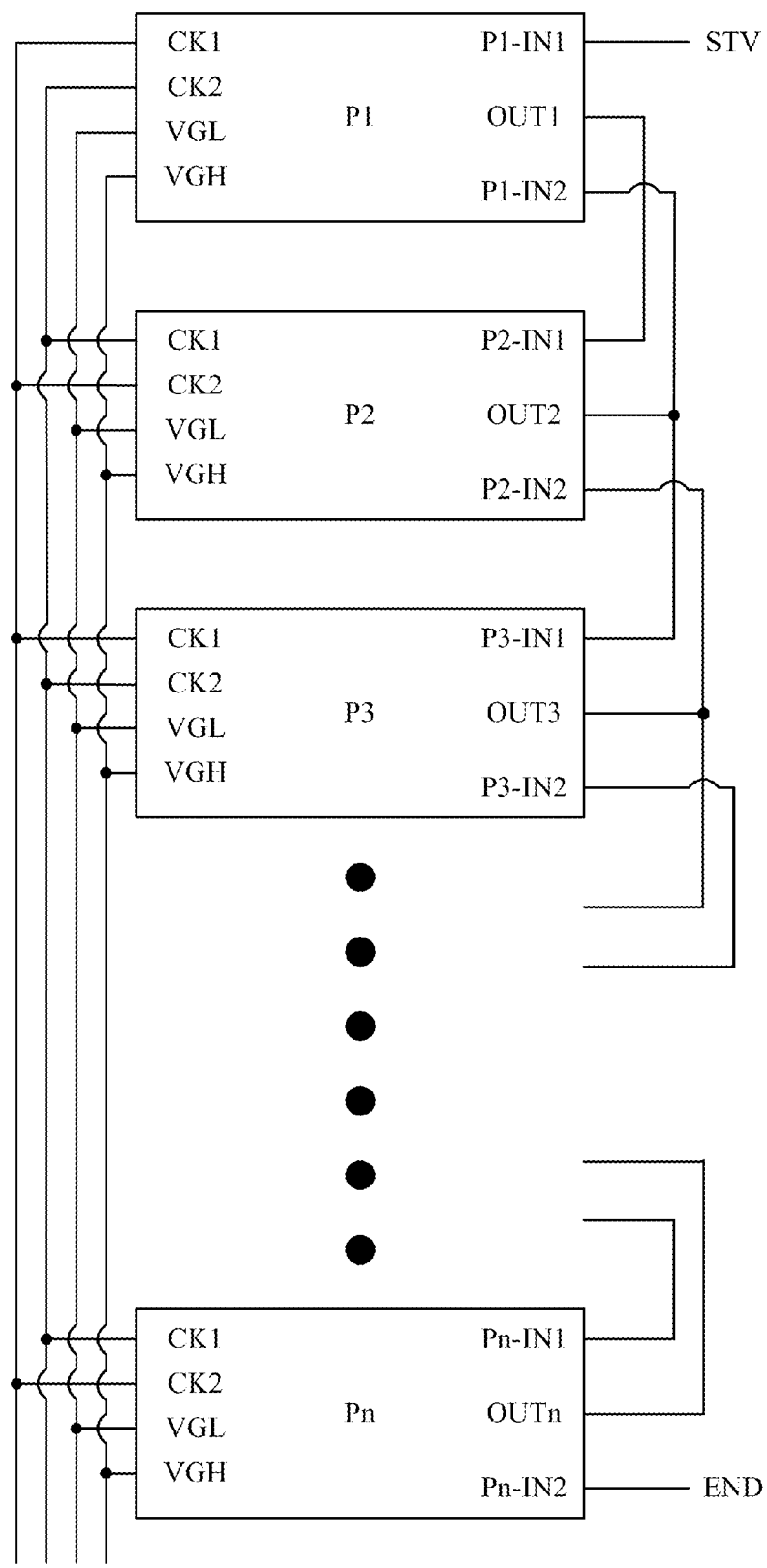
FIG. 3 is a schematic structural diagram of a group of shift registers according to an embodiment of the invention.

An embodiment of the invention further provides a group of shift registers comprising a number n of shift registers (n>1 and n is an integer) connected to each other to have n stages. As illustrated in FIG. 3, the group of shift registers comprises a first-stage shift register P1, a second-stage shift register P2, a third-stage shift register P3, . . . , and an n-th shift register Pn connected to each other to have n stages. An output terminal OUT1 of the first-stage shift register P1 is connected to a first input signal terminal P2-IN1 of the second-stage shift register P2, an output terminal OUT2 of the second-stage shift register P2 is connected to a second input signal terminal P1-IN2 of the first-stage shift register P1 and a first input signal terminal P3-IN1 of the third-stage shift register P3, an output terminal OUT3 of the third-stage shift register P3 is connected to a second input signal terminal P2-IN2 of the second-stage shift register P2 and a first input signal terminal P4-IN1 of the stage 4 shift register P4 (not illustrated), . . . , a first input signal terminal Pn-IN1 of the n-th shift register Pn is connected to an output terminal OUTn−1 of the (n−1)-th shift register (not illustrated), and a second input signal terminal Pn−1−IN2 of the (n−1)-th shift register (not illustrated) is connected to an output terminal OUTn of the n-th shift register.

First level signal terminals VGL of the respective stages of shift registers P1, P2, P3, . . . , Pn are connected in parallel, and second level signal terminals VGH of the respective stages of shift registers P1, P2, P3, . . . , Pn are connected in parallel.

First clock signal terminals CK1 of the odd-stage shift registers P1, P3, . . . , P2k−1 (k is a positive integer) are connected to each other, second clock signal terminals CK2 of the even-stage shift registers P2, P4, . . . , P2k are connected to each other, and the first clock signal terminals CK1 of the odd-stage shift registers P1, P3, . . . , P2k−1 are connected to the second clock signal terminals CK2 of the even-stage shift registers P2, P4, . . . , P2k.

Second clock signal terminals CK2 of the odd-stage shift registers P1, P3, . . . , P2k−1 are connected to each other, first clock signal terminals CK1 of the even-stage shift registers P2, P4, . . . , P2k are connected to each other, and the clock signal terminals CK2 of the odd-stage shift registers P1, P3, . . . , P2k−1 are connected to the first clock signal terminals CK1 of the even-stage shift registers P2, P4, . . . , P2k.

Furthermore all of the first transistor M1, the second transistor M2, the third transistor M3, the fourth transistor M4, the fifth transistor M5 and the sixth transistor M6 are PMOS transistors.

Furthermore a first input signal terminal P1-IN1 of the first-stage shift register P1 is connected to an initial signal terminal STV, and a second input signal terminal Pn-IN2 of the n-th shift register Pn is connected to a turn-off signal terminal END.

Figure 4:
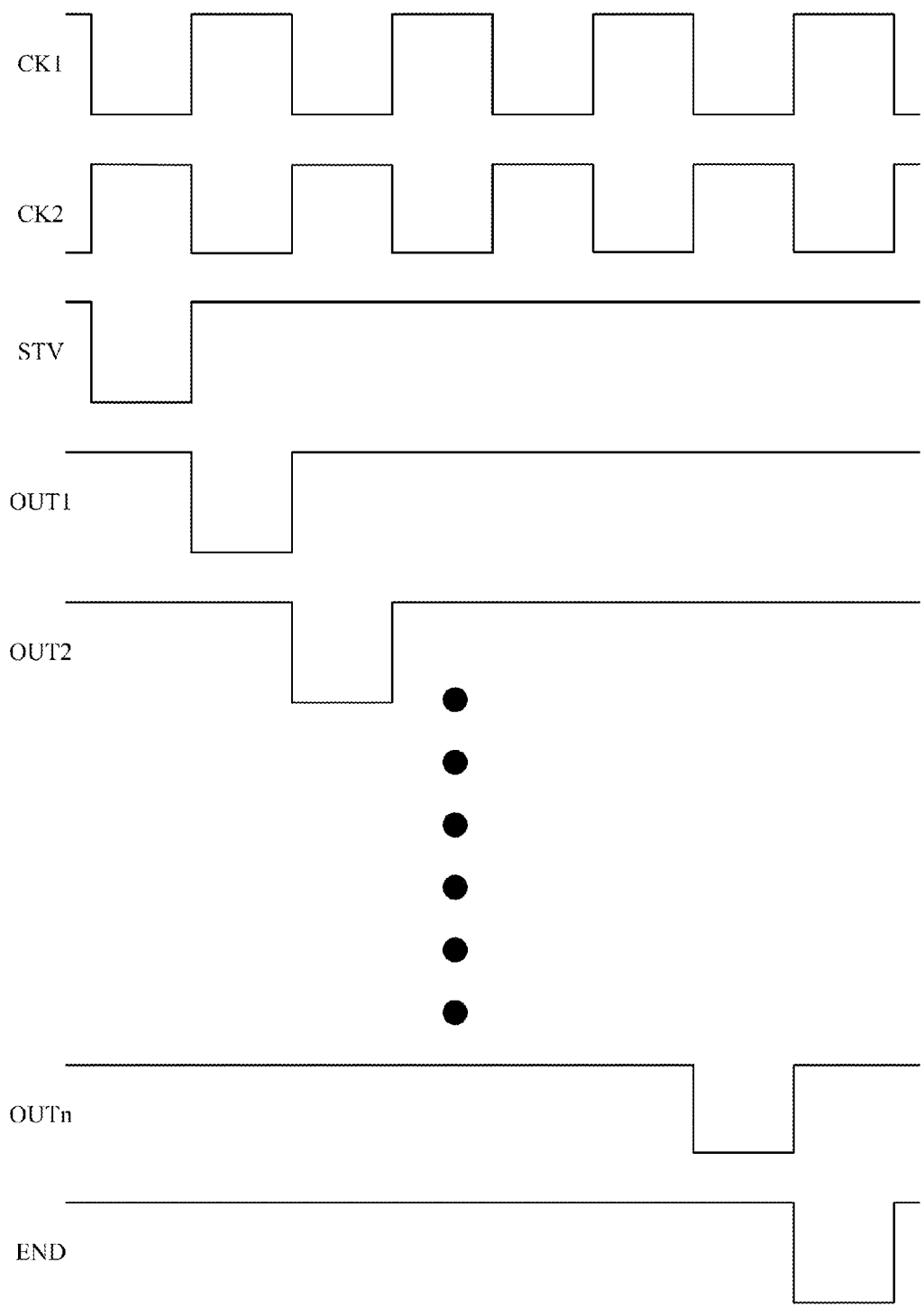
FIG. 4 is a timing diagram of the group of shift registers in FIG. 3 in operation.

An embodiment of the invention further provides a method of driving a group of shift registers, which can drive gates in a plurality of rows, and FIG. 4 illustrates a timing diagram of its circuit in operation, which will be described below with reference to FIG. 3 and FIG. 4.

A first clock signal CK1 is input to first clock signal terminals CK1 of the odd-stage shift registers P1, P3, . . . , P2k−1 (k is a positive integer) and second clock signal terminals CK2 of the even-stage shift registers P2, P4, . . . , P2k, a second clock signal CK2 is input to second clock signal terminals CK2 of the odd-stage shift registers P1, P3, . . . , P2k−1 and first clock signal terminals CK1 of the even-stage shift registers P2, P4, . . . , P2k, a first level signal is input to first level signal terminals VGL, and a second level signal is input to second level signal terminals VGH.

A signal at a first input signal terminal P2-IN1 of the second-stage shift register P2 is input to an output terminal OUT1 of the first-stage shift register P1 is connected to, signals at a second input signal terminal P1-IN2 of the first-stage shift register P1 and a first input signal terminal P3-IN1 of the third-stage shift register P3 are input to an output terminal OUT2 of the second-stage shift register P2, signals at a second input signal terminal P2-IN2 of the second-stage shift register P2 and a first input signal terminal P4-IN1 of the stage 4 shift register P4 (not illustrated) are input to an output terminal OUT3 of the third-stage shift register P3, . . . , a signal at an output terminal OUTn−1 of the (n−1)-th shift register is input to a first input signal terminal Pn-IN1 of the n-th shift register Pn, and a signal at an output terminal of the n-th shift register is input to a second input signal terminal of the (n−1)-th shift register.

Furthermore an initial signal is input to a first input signal terminal P1-IN1 of the first-stage shift register P1, and a turn-off signal is input to a second input signal terminal Pn-IN2 of the n-th shift register Pn is connected.

Referring to FIG. 4, in a first half of a first cycle, a low-level signal at an initial signal terminal STV is input to the first input signal terminal P1-IN1 of the first-stage shift register P1, and the first clock signal, the second clock signal, the first level signal and the second level signal are input respectively to the first clock signal terminal CK1, the second clock signal terminal CK2, the first signal level terminal VGL and the second level signal terminal VGH of the first-stage shift register P1 at the same timing as the first clock signal, the second clock signal, the first level signal and the second level signal in the shift register described above. As can be apparent from the timing of the shift register described above in operation, the first-stage shift register P1 is in the reset phase of its timing in operation, and the second clock signal at a high level is output at the output terminal OUT1 thereof in the first half of the cycle for initialization.

In a second half of the cycle, the initial level signal is changed to a high level, and the first-stage shift register P1 is in the shift phase of its timing in operation, and as can be apparent from the timing of the shift register described above in operation, the second clock signal at a low level is output at the output terminal OUT1 thereof in the second half of the cycle, thus shifting the initial signal at a low level backward by a half of the cycle.

At this time the low-level signal at the output terminal OUT1 of the first-stage shift register P1 is input to the first input signal terminal P2-IN1 of the second-stage shift register P2, the second clock signal at a low level is input to the first clock signal terminal CK1 thereof, the second-stage shift register P2 is in its reset phase, and a high-level signal is output at the output terminal P2-OUT. The high-level signal output at the output terminal P2-OUT of the second-stage shift register P2 is transmitted to the second input signal terminal P1-IN2 of the first-stage shift register P1 to make the first-stage shift register P1 enter the turn-off phase of a next cycle for to be further turned off. In a next cycle of the cycle, the second-stage shift register P2 repeats its operation similar to that of the first-stage shift register P1 so that a low level is output, thus turning on the third-stage shift register P3, and the second-stage shift register P2 is turned off by the output terminal P3-OUT of the third-stage shift register P3 after a delay of a half of the cycle. This process will be repeated so that the low-level signal output by the preceding stage of shift register is output by the next stage of shift register after being delayed by a half of the cycle to turn off the preceding stage of shift register.

At the end of the operation by the last stage of shift register, e.g., the n-th shift register Pn, it will not be turned off by any next stage of shift register, so a turn-off signal is provided to delay the output of the n-th shift register Pn by a half of the cycle as denoted by END in the timing diagram.

In the group of shift registers and method of driving the same according to the embodiments of the invention, the first clock signal is input to the first clock signal terminals of the odd-stage shift registers and the second clock signal terminals of the even-stage shift registers, and the second clock signal is input to the second clock signal terminals of the odd-stage shift registers and the first clock signal terminals of the even-stage shift registers, so that the function of driving row by row can be performed only using the two clock signals to thereby ensure a correct output of the circuit.

The group of shift registers according to the embodiment of the invention can be embodied in the capacitor-free structure while ensuring a correct output to thereby further lower the area of the scan circuit and make the frame edge further narrowed; and moreover each shift register in the group of shift registers comprises only six PMOS transistors for which there are two less masks than the scan circuit comprising NMOS transistors to thereby simplify process steps thereof.

It shall be noted that the foregoing embodiments can be referred to for and combined with each other. Although the invention has been disclosed as above in connection with the preferred embodiments thereof, they are not intended to limit the scope of the invention, and any those skilled in the art can make possible variations and modifications to the technical solution of the invention in light of the method and the disclosure above without departing from the spirit and scope of the invention, so any apparent modifications, equivalent changes and adaptations that can be made to the embodiments above in view of the technical essence of the invention without departing from the disclosure of the invention shall come into the scope of the technical solution of the invention.

What is claimed is:

1. A shift register, comprising:
   a first transistor;
   a second transistor;
   a third transistor;
   a fourth transistor;
   a fifth transistor; and
   a sixth transistor,
   wherein:
      a gate of the first transistor is connected to a first clock signal terminal, a source of the first transistor is connected to a first input signal terminal, and a drain of the first transistor is connected to a source of the second transistor and a gate of the sixth transistor,
      a gate of the second transistor is connected to a first level signal terminal, the source of the second transistor is connected to the drain of the first transistor and the gate of the sixth transistor, and a drain of the second transistor is connected to a gate of the third transistor,
      the gate of the third transistor is connected to the drain of the second transistor, a source of the third transistor is connected to a second clock signal terminal, and a drain of the third transistor is connected to an output terminal and a drain of the fifth transistor,
      a gate of the fourth transistor is connected to a source of the fourth transistor, the gate and the source of the fourth transistor are connected to a second input signal terminal, and a drain of the fourth transistor is connected to a gate of the fifth transistor and a drain of the sixth transistor,
      the gate of the fifth transistor is connected to the drain of the fourth transistor and the drain of the sixth transistor, a source of the fifth transistor is connected to a second level signal terminal and a source of the sixth transistor, and the drain of the fifth transistor is connected to the output terminal and the drain of the third transistor, and
      the gate of the sixth transistor is connected to the drain of the first transistor and the source of the second transistor, the source of the sixth transistor is connected to the second level signal terminal and the source of the fifth transistor, and the drain of the sixth transistor is connected to the drain of the fourth transistor and the gate of the fifth transistor.

2. The shift register according to claim 1, wherein the first transistor, the second transistor, the third transistor, the fourth transistor, the fifth transistor, and the sixth transistor are PMOS transistors.

3. The shift register according to claim 1, wherein an input signal at the first level signal terminal is a low-level signal, an input signal at the second level signal terminal is a high-level signal, a first input signal is input to the first input signal terminal, a second input signal is input to the second input signal terminal, a first clock signal is input to the first clock signal terminal, and a second clock signal is input to the second clock signal terminal, wherein the second clock signal is opposite in phase to the first clock signal.

4. A group of shift registers, comprising n shift registers according to claim 1, wherein n is a positive integer greater than 1, wherein the n shift registers are connected sequentially to form n stages, and wherein:
   the first level signal terminals of the respective stages of shift registers are connected to each other;
   the second level signal terminals of the respective stages of shift registers are connected to each other;
   the first clock signal terminals of odd-stage shift registers are connected to each other, the second clock signal terminals of even-stage shift registers are connected to each other, and the first clock signal terminals of the odd-stage shift registers are connected to the second clock signal terminals of the even-stage shift registers;
   the second clock signal terminals of the odd-stage shift registers are connected to each other, the first clock signal terminals of the even-stage shift registers are connected to each other, and the second clock signal terminals of the odd-stage shift registers are connected to the first clock signal terminals of the even-stage shift registers;
   the first input signal terminal of an n-th shift register is connected to the output terminal of an (n−1)-th shift register; and
   the second input signal terminal of the (n−1)-th shift register is connected to the output terminal of the n-th shift register.

5. The group of shift registers according to claim 4, wherein the first input signal terminal of a first-stage shift register is connected to an initial signal terminal, and the second input signal terminal of an n-th shift register is connected to a turn-off signal terminal.

6. The group of shift registers according to claim 4, wherein the first transistors, the second transistors, the third transistors, the fourth transistors, the fifth transistors and the sixth transistors are PMOS transistors.

7. A method of driving the shift register according to claim 1, the method comprising:

during a reset phase:
- inputting a first clock signal to the first clock signal terminal to turn on the first transistor;
- inputting a first input signal to the first input signal terminal;
- transmitting the first input signal by the first transistor to the gate of the sixth transistor and the source of the second transistor to turn on the sixth transistor;
- inputting a second level signal to the second level signal terminal;
- transmitting the second level signal by the sixth transistor to the gate of the fifth transistor to turn off the fifth transistor;
- inputting a first level signal to the first level signal terminal to turn on the second transistor;
- transmitting the first input signal by the second transistor to the gate of the third transistor to turn on the third transistor;
- inputting a second clock signal to the second clock signal terminal; and
- transmitting the second clock signal by the third transistor to the output terminal;

during a shift phase:
- inputting the first clock signal to the first clock signal terminal to turn off the first transistor;
- maintaining the sixth transistor and the third transistor in an on state;
- inputting the second clock signal to the second clock signal terminal;
- transmitting the second clock signal by the third transistor to the output terminal;

and during a turn-off phase:
- inputting the first clock signal to the first clock signal terminal to turn on the first transistor;
- inputting the first input signal to the first input signal terminal;
- transmitting the first input signal by the first transistor to the gate of the sixth transistor and the source of the second transistor to turn off the sixth transistor;
- inputting the first level signal to the first level signal terminal to turn on the second transistor;
- inputting the first input signal to the source of the second transistor;
- transmitting the first input signal by the second transistor to the gate of the third transistor to turn off the third transistor;
- inputting the second input signal to the second input signal terminal to turn on the fourth transistor;
- transmitting the second input signal by the fourth transistor to the gate of the fifth transistor to turn on the fifth transistor;
- inputting the second level signal to the second level signal terminal; and
- transmitting the second level signal by the fifth transistor to the output terminal.

8. The method of driving a shift register according to claim 7, wherein the first transistor, the second transistor, the third transistor, the fourth transistor, the fifth transistor and the sixth transistor are PMOS transistors.

9. The method of driving a shift register according to claim 8, wherein the first level signal is a low-level signal, the second level signal is a high-level signal, the first clock signal is a low-level pulse signal, and the second clock signal is opposite in phase to the first clock signal.

10. A method of driving the group of shift registers according to claim 4, the method comprising:
- inputting an initial signal to the first input signal terminal of the first-stage shift register;
- inputting a first clock signal to the first clock signal terminals of the odd-stage shift registers and to the second clock signal terminals of the even-stage shift registers;
- inputting a second clock signal to the second clock signal terminals of the odd-stage shift registers and to the first clock signal terminals of the even-stage shift registers;
- inputting a first level signal to the first level signal terminals of the respective stages of shift registers;
- inputting a second level signal to the second level signal terminals of the respective stages of shift registers;
- inputting an output signal of the n-th shift register to the second input signal terminal of the (n−1)-th shift register;
- inputting an output signal of the (n−1)-th shift register to the first input signal terminal of the n-th shift register; and
- inputting a turn-off signal to the second input signal terminal of the n-th shift register.

11. The method of driving a shift register according to claim 10, wherein the first level signal is a low-level signal, the second level signal is a high-level signal, the first clock signal is a low-level pulse signal, and the second clock signal is opposite in phase to the first clock signal.

12. The method of driving a shift register according to claim 10, wherein the first transistors, the second transistors, the third transistors, the fourth transistors, the fifth transistors and the sixth transistors are PMOS transistors.

* * * * *